(12) United States Patent
Lee et al.

(10) Patent No.: US 7,410,593 B2
(45) Date of Patent: Aug. 12, 2008

(54) PLASMA ETCHING METHODS USING NITROGEN MEMORY SPECIES FOR SUSTAINING GLOW DISCHARGE

(75) Inventors: Hong-Ji Lee, Gueishan Township (TW); Shih-Ping Hong, Taichung (TW); An-Chyi Wei, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 5 days.

(21) Appl. No.: 11/359,787

(22) Filed: Feb. 22, 2006

(65) Prior Publication Data

US 2007/0193977 A1    Aug. 23, 2007

(51) Int. Cl.
*B44C 1/22* (2006.01)
*H01L 21/302* (2006.01)

(52) U.S. Cl. ............................ 216/67; 216/58; 438/706; 438/710

(58) Field of Classification Search ................ 216/58, 216/67; 438/706, 710
See application file for complete search history.

(56) References Cited

U.S. PATENT DOCUMENTS

| | | | |
|---|---|---|---|
| 4,990,229 | A | 2/1991 | Campbell et al. |
| 5,032,205 | A | 7/1991 | Hershkowitz et al. |
| 5,091,049 | A | 2/1992 | Campbell et al. |
| 5,122,251 | A | 6/1992 | Campbell et al. |
| 5,783,100 | A | 7/1998 | Blalock et al. |
| 6,349,744 | B1 * | 2/2002 | Grosshart ................ 137/884 |
| 6,566,270 | B1 * | 5/2003 | Liu et al. ................ 438/706 |
| 6,635,185 | B2 * | 10/2003 | Demmin et al. .......... 216/64 |
| 6,736,944 | B2 | 5/2004 | Buda |

(Continued)

OTHER PUBLICATIONS

Coburn, et al., "Some Chemical Aspects of the Fluorocarbon Plasma Etching of Silicon and Its Compounds", *IBM J. Res. Develop.*, vol. 23, No. 1 (1979).
March Plasmas Systems, "Controlled Chemical Plasma Etching for Advanced Technology Applications", (2000).

(Continued)

*Primary Examiner*—Shamim Ahmed
(74) *Attorney, Agent, or Firm*—Jianq Chyun IP Office

(57) ABSTRACT

Methods are described which comprise: providing a plasma etching apparatus having an etching chamber; disposing a substrate to be etched in the chamber; introducing $N_2$ gas and one or more process gases into the chamber; and etching the substrate, wherein the introduction of the $N_2$ gas is stopped prior to etching, and wherein etching comprises an initial plasma ignition wherein at least a portion of the $N_2$ gas remains present in the chamber during initial plasma ignition. Additional methods are described which comprise: providing a plasma etching apparatus having an etching chamber; disposing a substrate to be etched in the chamber; introducing $N_2$ gas and one or more process gases into the chamber; applying power to an electrode in the chamber such that an $N_2$ memory species is formed; and etching the substrate, where the introduction of the $N_2$ gas into the chamber can be stopped prior to etching. Other methods are also described which comprise: providing a plasma etching apparatus having an etching chamber; disposing a substrate to be etched in the chamber; introducing $N_2$ gas into the chamber; applying power to an electrode in the chamber such that an $N_2$ memory species is formed; removing the applied power from the electrode in the chamber; stopping the introduction of the $N_2$ gas into the chamber and introducing one or more process gases into the chamber; and etching the substrate.

17 Claims, 3 Drawing Sheets

U.S. PATENT DOCUMENTS

| | | | |
|---|---|---|---|
| 6,756,559 | B2 | 6/2004 | Seo |
| 6,849,123 | B2 | 2/2005 | Niino et al. |
| 6,887,793 | B2 | 5/2005 | Chang et al. |
| 6,919,282 | B2 | 7/2005 | Sakama et al. |
| 2004/0147101 | A1* | 7/2004 | Pomarede et al. ........... 438/591 |
| 2005/0164523 | A1* | 7/2005 | Sugawara et al. ........... 438/791 |
| 2006/0232214 | A1* | 10/2006 | Seeley ................... 315/111.21 |

OTHER PUBLICATIONS

Ptak, et al., "Influence of Active Nitrogen Species on the Nitridation Rate of Sapphire", *MRS Internet J. Nitride Semicond.* Res. 4S1, G3 10 (1999).

Lowke et al., "Theory of electric corona including the role of plasma chemistry", *Pure & Appl. Chem.*, vol. 66, No. 6, pp. 1287-1294 (1994).

http://www.mines.edu, "Plasma Etching Procedure", 4 pages (2005).

* cited by examiner

Main Etching (1st Substep) –
N₂ memory species creating step prior to ignition

Main Etching (1st Substep) –
No N₂ introduced in prior ignition step

PLASMA ETCHING METHODS USING NITROGEN MEMORY SPECIES FOR SUSTAINING GLOW DISCHARGE

BACKGROUND OF THE INVENTION

Dry etching is frequently employed during semiconductor manufacturing for forming structures with small feature sizes. In dry etching, gases are the primary etching medium and the substrate, such as a semiconductor silicon wafer, is etched without wet chemicals (i.e., without etching solutions). During dry etching processes, the material being etched is converted into gas phase materials which are removed from the etching chamber by a vacuum system.

One example of dry etching is plasma etching. Plasma etching utilizes a plasma as the etching medium. Etching plasmas contain many different gaseous species, including ions, free radicals, electrons, photons, neutrals and reaction byproducts.

In one known method of plasma etching referred to parallel plate reaction plasma etching, a process chamber (e.g., the plasma etching chamber) is evacuated and a gas mixture is fed into the chamber and energized to a plasma state using a radio frequency (RF) source. The RF source is capacitively coupled to a substrate to be etched and to an electrode, while another electrode or the inner wall of the chamber is grounded. Positive voltages applied to the one electrode are typically on the order of several hundred volts. The gas mixture forms a glow discharge. Glow discharges are non-equilibrium plasmas wherein the electron temperature is greater than the gas temperature and the ratio of electrons to neutral species is typically in the range of $10^{-6}$ to $10^{-4}$. Under these conditions wherein a glow discharge has been created and the voltage potential between the electrodes is large enough, the substrate is bombarded by energized particles which arrive at a normal incidence to the substrate and produce an anisotropic etch.

While plasma etching offers a valuable tool in performing precise etching of various substrates at the decreased dimensions required by current circuit integration standards, plasma etching suffers from a variety of problems. One problem in particular is that of maintaining the glow discharge during plasma ignition. Often, it is necessary to employ high pressures and/or greatly increased gas flow rates in order to maintain the glow discharge plasma within the etching chamber. Unfortunately, an associated drawback of using higher pressures and increased flow rates is damage to the patterned profiles. Inability to maintain the glow discharge, especially in multi-step etching processes, due to reductions in pressure or decreased flow rates leads to significantly decreased process efficiency and increased unit costs.

Thus, there is a need in the art for plasma etching methods which are able to maintain a glow discharge while also operating at lower pressures and without increased gas flow rates.

BRIEF SUMMARY OF THE INVENTION

The present invention relates, in general, to methods of plasma etching, and more particularly, to methods of plasma etching in which a nitrogen ($N_2$) memory species is formed in the etching chamber. Methods according to the present invention provide improved glow discharge ignition characteristics and allow plasma etching with lower pressures and/or gas flow rates.

While not being bound to any particular theory, it is believed that methods according to the present invention provide $N_2$ memory species which survive in the afterglow of a plasma glow discharge, and that such active species drive or assist in glow discharge ignition and may help sustain a glow discharge in subsequent etching. Accordingly, methods of the present invention do not require elevated chamber pressures and/or high gas flow rates, and do not suffer from extinguished glow discharges associated with rapid pressure or flow drops. Methods in accordance with the present invention which include the introduction of a nitrogen ($N_2$) memory species can provide an improved glow discharge on-rate of up to 80% or greater, without the use of undesirable prior art ignition conditions such as elevated chamber pressures and/or high gas flow rates. The improved glow discharge on-rate is preferably at least about 90%, and more preferably at least about 95%. In certain embodiments, glow discharge on-rates of greater than 99% can be achieved.

One embodiment of the present invention includes methods which comprise: providing a plasma etching apparatus having an etching chamber; disposing a substrate to be etched in the chamber; introducing $N_2$ gas and one or more process gases into the chamber; and etching the substrate, wherein the introduction of the $N_2$ gas is stopped prior to etching, and wherein etching comprises an initial plasma ignition wherein at least a portion of the $N_2$ gas remains present in the chamber during initial plasma ignition.

Another embodiment of the present invention includes methods which comprise: providing a plasma etching apparatus having an etching chamber; disposing a substrate to be etched in the chamber; introducing $N_2$ gas and one or more process gases into the chamber; applying power to an electrode in the chamber such that an $N_2$ memory species is formed; and etching the substrate. In certain preferred embodiments, the introduction of the $N_2$ gas into the chamber is stopped prior to etching.

Yet another embodiment of the present invention includes methods which comprise: providing a plasma etching apparatus having an etching chamber; disposing a substrate to be etched in the chamber; introducing $N_2$ gas into the chamber; applying power to an electrode in the chamber such that an $N_2$ memory species is formed; removing the applied power from the electrode in the chamber; stopping the introduction of the $N_2$ gas into the chamber and introducing one or more process gases into the chamber; and etching the substrate.

In various preferred embodiments of the present invention, the one or more process gases comprises oxygen ($O_2$). In various preferred embodiments of the present invention, the substrate comprises a semiconductor substrate.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
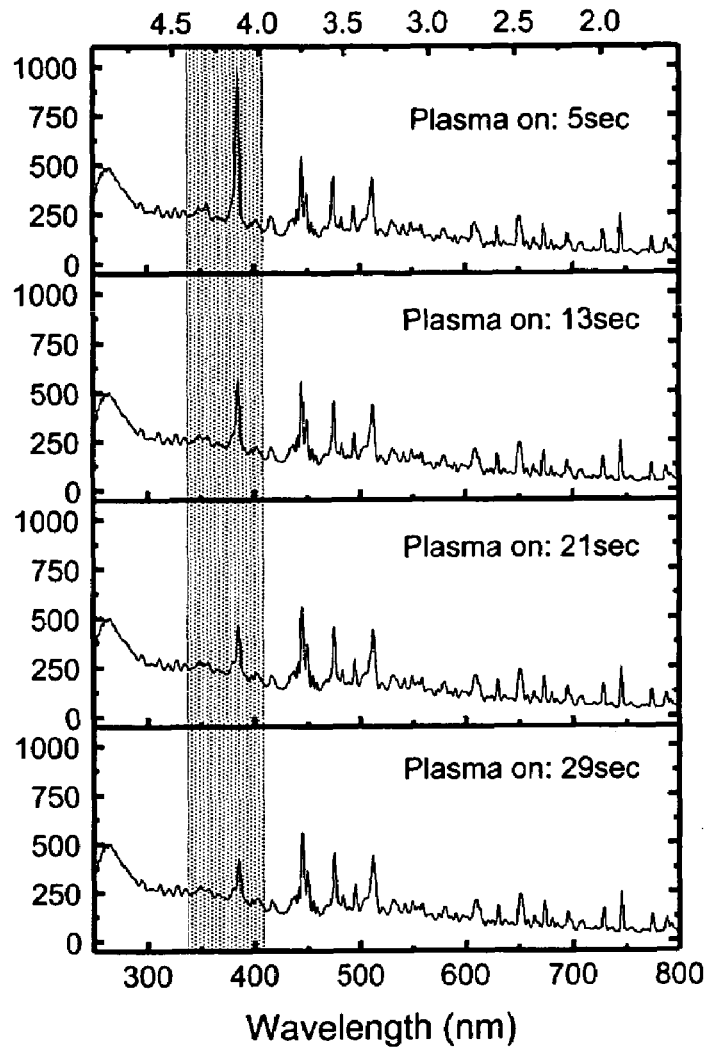
FIG. 1a is an optical emission spectrum of the contents of an etching chamber during a method carried out in accordance with one embodiment of the present invention, in accordance with the process set forth in Example 3.

Methods in accordance with the present invention include providing a plasma etching apparatus having an etching chamber. Plasma etching apparatus which are suitable for use in the present invention include any plasma etching devices or systems which provide a vacuum chamber with one or more electrodes capable of subjecting the gases contained in the chamber to an electric field sufficient to create a plasma in the chamber. Various suitable plasma etching apparatus are available commercially from, for example, Lam Research Corp., Applied Materials, Inc. and Tokyo Electron Ltd., and can also be constructed using designs and parts known in the art or to be developed. In general, an etching chamber is capable of maintaining a vacuum and will have at least one gas input opening connected to a gas source, preferably with a mass flow metering device.

Methods according to the present invention also include disposing a substrate to be etched in the etching chamber. In general, a substrate is provided in the etching chamber prior to the introduction of any gases or the creation of a vacuum within the chamber. The substrate can be positioned in any suitable manner for etching, and in certain embodiments the etching apparatus can comprise a substrate holder on which the substrate may be disposed.

Substrates which may be etched in accordance with the present invention include, but are not limited to, semiconductor substrates such as, for example, silicon wafers. The substrate may be a semiconductor device such as, for example, a memory array of transistors (e.g., MOSFETs) disposed on a silicon wafer covered by a dielectric material which is further covered by a patterned photoresist layer which can serve as an etch mask.

Methods in accordance with various embodiments of the present invention include introducing one or more process gases into the etching chamber. Process gases refer to the etching recipe ingredients which form the plasma glow discharge and provide the active species (e.g., ions, electrons, neutral species, etc.) which bombard the substrate and etch the material to be removed. The methods of the present invention are applicable to any plasma etching recipe. Suitable process gases for use in the methods of the present invention include, but are not limited to, fluorine compounds, chlorine compounds, oxygen compounds and various inert gases. Exemplary fluorine compounds include, for example, $CF_4$, $CHF_3$, $CH_2F_2$, $CH_3F$, $C_3F_8$, $C_4F_6$, $C_4F_8$, $C_5F_8$ and $SF_6$. Exemplary chlorine compounds include, for example, $Cl_2$, $BCl_3$ and $SiCl_4$. Exemplary oxygen compounds include, for example, $O_2$ and CO. Suitable inert gases which may be included in etching recipes, and which may be introduced into the etching chamber alone or with the one or more process gases include, for example, argon and helium.

All gases which may be used in accordance with the methods of the present invention, including $N_2$ gas and the one or more process gases, can be introduced into the etching chamber via one or more gas inlets. A gas inlet can comprise an opening in fluid communication with the etching chamber and which is connected to the gas source. A gas inlet can preferably be fitted with a mass flow measuring valve or other device.

Each of the one or more process gases can be introduced into the etching chamber at any suitable flow rate. A suitable flow rate for all combined process gases introduced into an etching chamber is at least great enough to maintain the plasma once ignited, and is generally low enough to maintain a suitable pressure so as to not cause unnecessary damage to the substrate being etched.

The methods of the present invention also include introducing $N_2$ gas into the etching chamber. $N_2$ gas can be introduced alone or along with the one or more process gases. Suitable flow rates for the introduction of the $N_2$ gas into the etching chamber can be about 10 to about 500 sccm. Preferably, $N_2$ gas is introduced at about 20 to about 300 sccm, more preferably at about 50 to about 200 sccm and most preferably at about 50 to about 150 sccm. The total flow rate will depend on the reaction pressure and should be at least high enough to maintain the plasma once it is ignited.

As used herein, the term "$N_2$ memory species" refers to any one or more of the active chemical species of nitrogen which survives in the afterglow of a glow discharge. While not being bound to any particular theory, it is believed that the $N_2$ memory species survive in the metastable energy levels and in the $A^3\Sigma$ state. The $N_2$ memory species remain in the etching chamber after an initial glow discharge containing nitrogen gas is extinguished, and the memory species are believed to provide initial electrons and/or ions and/or other species that enable subsequent plasmas to be more easily ignited to form glow discharges.

The methods of the present invention include etching a substrate. The substrate can be etched isotropically or, preferably, anisotropically. The substrate can have a patterned layer on an upper surface, wherein the patterned layer serves as a mask for etching the pattern into the material below. Etching the substrate in accordance with the methods of the present invention is carried out by applying power to an electrode, e.g., a capacitively coupled plasma source, or by applying RF power to two plasma generating modules, e.g., an inductively coupled plasma source, in the etching chamber to create an electric field within the chamber. The electrode or inductive coil is responsive to an RF source having a frequency in the range of 1 to 100 MHz, typically 13.56 MHz. Other frequencies such as 2 MHz, 27 MHz or 60 MHz are also applied in some commercial tools. The source power applied to the electrode can be about 50 watts to about 2500 watts (W).

Certain methods in accordance with the present invention include removing power from the source electrode, and where power is also applied to a second electrode, removing power from the second electrode (i.e., removing the electric field). Reference to removal of power "from the electrode" refers to stopping the flow of power to the source electrode, or to both electrodes where the apparatus comprises two electrodes.

In one embodiment of the present invention, the $N_2$ gas is introduced into the etching chamber of a plasma etching apparatus and the flow of the $N_2$ gas is stopped prior to initial plasma ignition such that at least a portion of the $N_2$ gas remains present in the etching chamber during initial plasma ignition. Initial plasma ignition refers to the application of power to one or more etching chamber electrodes to create an electric field within the chamber, shortly after the flow of the $N_2$ gas is stopped. In certain embodiments, the $N_2$ gas is introduced into the etching chamber along with the one or more process gases. The flow of the one or more process gases is continued after the flow of the $N_2$ gas is stopped. After the flow of the $N_2$ gas is stopped, but while at least some $N_2$ gas remains in the etching chamber, an electric field is created within the etching chamber to ignite the one or more process gases and create a glow discharge. The creation of an electric field is suitably accomplished by applying power to a chamber electrode and grounding either the chamber inner wall or a second chamber electrode.

In another embodiment of the present invention, $N_2$ gas and one or more process gases are introduced into the chamber after the substrate is disposed in the chamber for etching and power is applied to an electrode in the chamber such that an $N_2$ memory species is formed. The flow of the $N_2$ gas can then be stopped and the substrate is etched as power is continually applied to the electrode. The amount of time during which $N_2$ gas is being introduced into the chamber while power is applied to the electrode is from about 1 second to about 10 seconds. Preferably, the flow of $N_2$ gas is stopped within about 3-5 seconds after initial application of power to the electrode.

In another embodiment of the present invention, $N_2$ gas is introduced into the chamber after the substrate is disposed in the chamber for etching and power is applied to an electrode in the chamber such that an $N_2$ memory species is formed. Power is applied during the $N_2$ memory species creating step, in general, for about 1 to about 10 seconds, preferably about 3 to about 10 seconds, and more preferably about 3 to about 8 seconds. The applied power is then removed from the electrode and the introduction of the $N_2$ gas into the chamber is stopped. One or more process gases is then introduced into the chamber until a steady state condition is reached, generally for about 5 to about 20 seconds; and the substrate is subsequently etched by applying power to the electrode.

The present invention will now be illustrated in more detail by reference to the following specific, non-limiting examples.

EXAMPLE 1

In a LAM Model 9400PTX plasma etching apparatus, a substrate having an organic antireflective coating disposed on a surface thereof was placed on the substrate holder of the apparatus. The substrate was then subjected to three separate sets of conditions as shown below in Table 1. In a first "stable" phase, oxygen, helium and $N_2$ are introduced at the flow rates and pressures indicated in Table 1 with no power applied. In a second phase (1$^{st}$ Substep), the flow of $N_2$ is stopped and a source power of 240 W, at 13.56 MHz is applied to the electrode and 70 W at 13.56 MHz is applied to the second (bias) electrode.

TABLE 1

| $N_2$ Effect (No Plasma) | | | |
|---|---|---|---|
| | Stable | 1$^{st}$ Substep | 2$^{nd}$ Substep |
| Pressure (mt) | 5 | 5 | 5 |
| Source power (W) (13.56 MHz) | 0 | 240 | 240 |
| Bias Power (W) (13.56 MHz) | 0 | 70 | 70 |
| O$_2$ flow (sccm) | 10 | 10 | 10 |
| He flow (sccm) | 40 | 40 | 40 |
| N$_2$ flow (sccm) | 100 | 0 | 0 |
| Backside He pressure (T) | 8 | 8 | 8 |
| Time (s) | ~10-20 | EP mode | 5 |
| Glow discharge on-rate | N/A | Up to <80% | 100% |

In the Stable step, the reaction gases are allowed to stabilize prior to the application of power. In the 1$^{st}$ Substep, "EP mode" refers to endpoint etching wherein the etching occurs for an appropriate amount of time (e.g., ~50 s) until a predetermined endpoint is detected by optical emission spectroscopy (OES). In this Example, in the 1$^{st}$ Substep, plasma ignition can fail occasionally such that the process stops. The glow discharge on-rate can be as high as about 80%, which is a significant improvement over prior art etching procedures which do not introduce nitrogen into the etching chamber. The glow discharge on-rate is 100% in the 2$^{nd}$ substep.

EXAMPLE 2

In a process using the same type of plasma etching apparatus and a similar substrate as Example 1, the substrate was then subjected to four separate sets of conditions as shown below in Table 2. In a first "stable" phase, oxygen, helium and $N_2$ are introduced at the flow rates and pressures indicated in Table 2 with no power applied. In this Example, a separate ignition step is included (independent of the 1$^{st}$ Substep) wherein $N_2$ continues to be introduced while power is applied. A source power of 240 W, at 13.56 MHz is applied to the electrode and 70 W at 13.56 MHz is applied to the second (bias) electrode for approximately 3 seconds. The flow of $N_2$ gas into the chamber is then stopped, and the substrate is subsequently etched. "EP mode" refers to endpoint etching wherein the etching occurs until a predetermined endpoint is detected by optical emission spectroscopy (OES).

TABLE 2

| $N_2$ Memory Effect (Plasma) | | | | |
|---|---|---|---|---|
| | Stable | Ignition | 1$^{st}$ Substep | 2$^{nd}$ Substep |
| Pressure (mt) | 5 | 5 | 5 | 5 |
| Source power (W) (13.56 MHz) | 0 | 240 | 240 | 240 |
| Bias Power (W) (13.56 MHz) | 0 | 70 | 70 | 70 |
| O$_2$ flow (sccm) | 10 | 10 | 10 | 10 |
| He flow (sccm) | 40 | 40 | 40 | 40 |
| N$_2$ flow (sccm) | 100 | 100 | 0 | 0 |
| Backside He pressure (T) | 8 | 8 | 8 | 8 |
| Time (s) | ~10-20 | 3 | EP mode | 5 |
| Glow discharge on-rate | N/A | ≧99% | 100% | 100% |

The etching process runs smoothly with limited or no failure. The process failure rate in this example is less than or equal to 1%.

EXAMPLE 3

In a process using the same type of plasma etching apparatus and a similar substrate as Example 1, the substrate was then subjected to five separate sets of conditions as shown below in Table 3. In a first "stable" phase $N_2$ is introduced at the flow rate and pressure indicated in Table 3, with no power applied. A source power of 240 W, at 13.56 MHz is applied to the electrode and 70 W at 13.56 MHz is applied to the second (bias) electrode for approximately 3 seconds. The application of power to the electrodes and the flow of $N_2$ gas into the chamber are then stopped for about 20 seconds. During this second stabilizing (Stable-2) step, the reaction gases and other parameters for the main etching steps are allowed to stabilize before applying power. Subsequently, power is applied as indicated in Table 3, and the substrate is etched. As shown in FIG. 1a, the $N_2$ memory species created in the Memory Species Creating Step show a specific signal at 385 nm, and these species persist in the beginning of the 1$^{st}$ Substep. Additionally, as shown in the spectra, the $N_2$ memory species continue to exist in the steps following Ignition (Stable-2 and 1$^{st}$ Substep). The $N_2$ memory species continue to exist at least about 13 seconds after the beginning (plasma-on) of the 1$^{st}$ Substep.

TABLE 3

N₂ Memory Effect (Plasma)

|  | Stable-1 | Memory Species Creating Step | Stable-2 | 1st Substep | 2nd Substep |
|---|---|---|---|---|---|
| Pressure (mt) | 5 | 5 | 5 | 5 | 5 |
| Source power (W) (13.56 MHz) | 0 | 240 | 0 | 240 | 240 |
| Bias Power (W) (13.56 MHz) | 0 | 70 | 0 | 70 | 70 |
| O₂ flow (sccm) | 0 | 0 | 10 | 10 | 10 |
| He flow (sccm) | 0 | 0 | 40 | 40 | 40 |
| N₂ flow (sccm) | 100 | 100 | 0 | 0 | 0 |
| Backside He pressure (T) | 8 | 8 | 8 | 8 | 8 |
| Time (s) | ~10-20 | 3 | ~20 | EP mode | 5 |
| Glow discharge on-rate | N/A | ≧99% | N/A | 99% | 100% |

Figure 2:
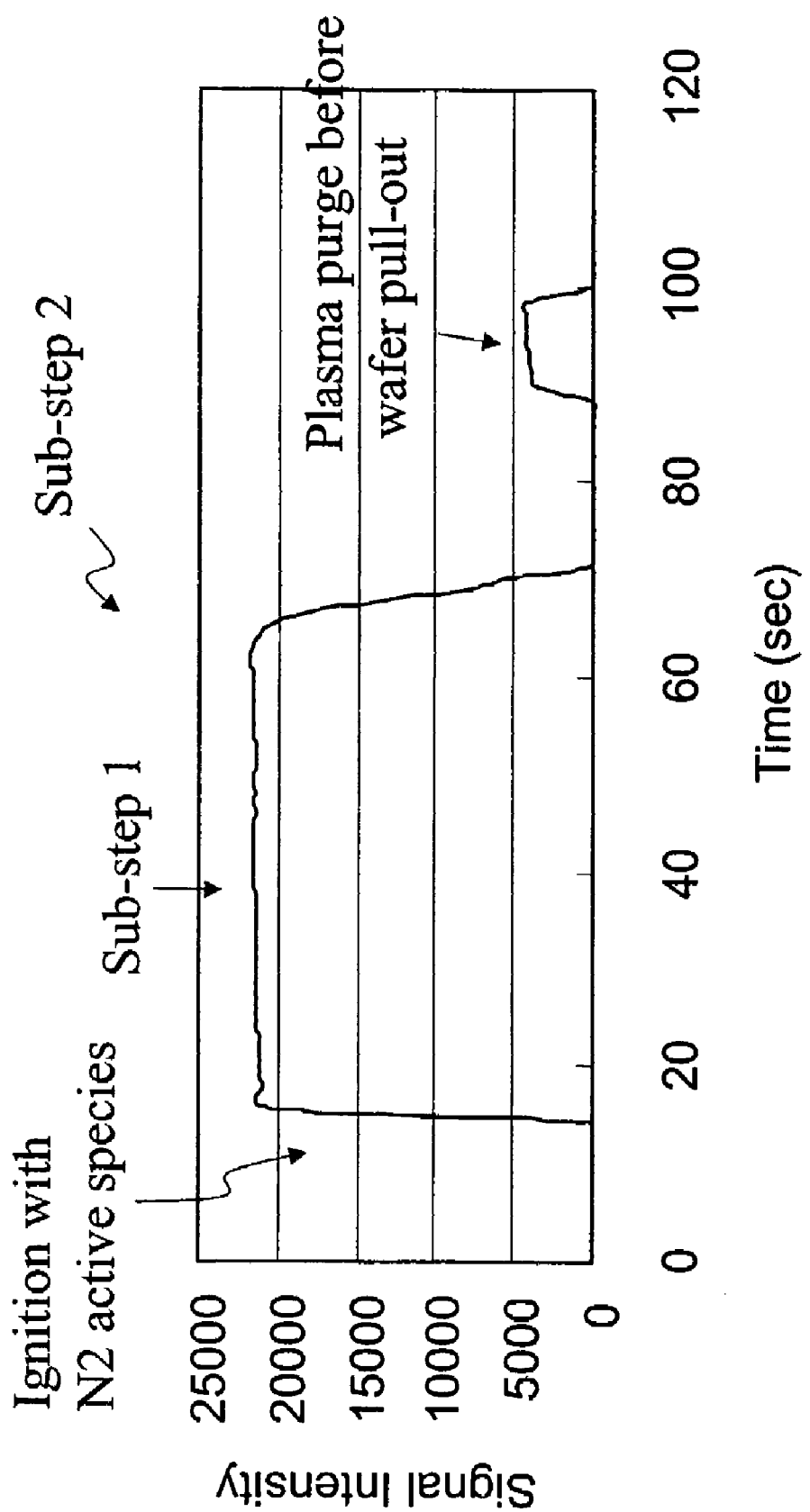
FIG. 2 is a graphical representation of the glow discharge intensity during a method carried out in accordance with one embodiment of the present invention.

The etching process runs smoothly with limited or no failure. The process failure rate in this example is less than or equal to 1%. As shown in FIG. 2, the glow discharge intensity remains high throughout the main etching step (1$^{st}$ Substep) and only declines during the 5 second over-etch step (2$^{nd}$ Substep) as power is removed.

COMPARATIVE EXAMPLES A & B

In Comparative Example A, using the same type of plasma etching apparatus and a similar substrate as Example 1, the substrate was then subjected to three separate sets of conditions as shown below in Table 4. In the absence of N₂ flow into the chamber and with similar process flow and pressure conditions compared to Example 1, the glow discharge on-rate was below 40% during the 1$^{st}$ substep. While the glow discharge on-rate during the 2$^{nd}$ substep was 100% when the 1$^{st}$ substep plasma remained ignited, it was 0% when the 1$^{st}$ substep plasma failed to remain ignited.

TABLE 4

No Extra Ignition Step

|  | Stable | 1st Substep | 2nd Substep |
|---|---|---|---|
| Pressure (mt) | 5 | 5 | 5 |
| Source power (W) (13.56 MHz) | 0 | 240 | 240 |
| Bias Power (W) (13.56 MHz) | 0 | 70 | 70 |
| O₂ flow (sccm) | 10 | 10 | 10 |
| He flow (sccm) | 40 | 40 | 40 |
| N₂ flow (sccm) | 0 | 0 | 0 |
| Backside He pressure (T) | 8 | 8 | 8 |
| Time (s) | ~10-20 | EP mode | 5 |
| Glow discharge on-rate | N/A | Up to <40% | 0%/100% |

Figure 1B:
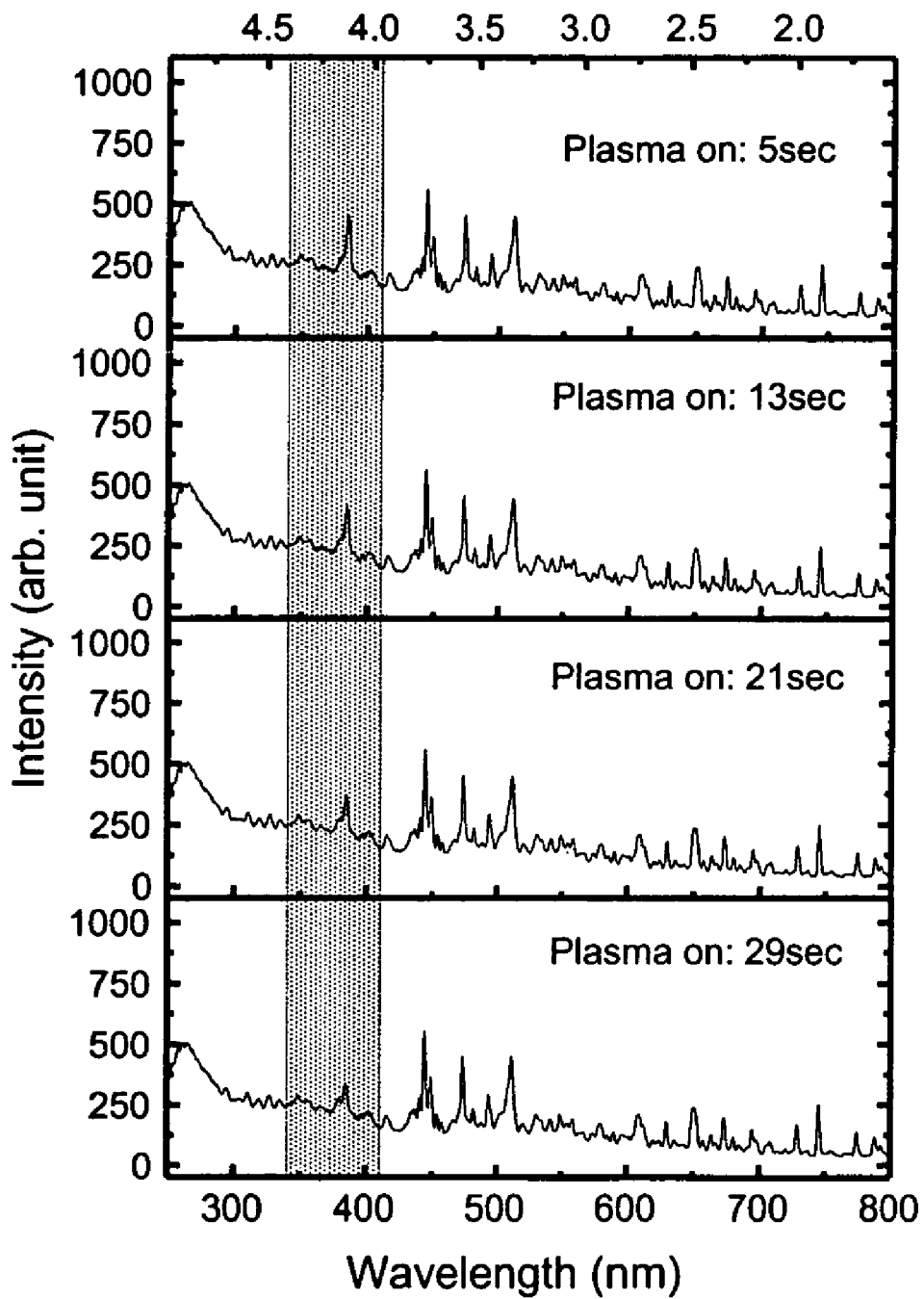
FIG. 1b is an optical emission spectrum of the contents of an etching chamber during an etching process where no $N_2$ gas is introduced during the ignition step, in accordance with the process set forth in Comparative Example B.

In Comparative Example B, using the same type of plasma etching apparatus and a similar substrate as Example 1, the substrate was then subjected to four separate sets of conditions as shown below in Table 5. In the absence of N₂ flow into the chamber and with increased (but undesirable) pressure conditions compared to Examples 1-3, the glow discharge on-rate was still below 70% during ignition. During the 1$^{st}$ and 2$^{nd}$ substeps, the glow discharge on-rate was 100% when the plasma ignited, but 0% when ignition failed. As shown in FIG. 1b, there is no obvious signal change at the wavelength of 385 nm indicating the absence of N₂ memory species.

TABLE 5

Ignition Step with Higher Pressure

|  | Stable | Ignition | 1st Substep | 2nd Substep |
|---|---|---|---|---|
| Pressure (mt) | ~12-15 | ~12-15 | 5 | 5 |
| Source power (W) (13.56 MHz) | 0 | 240 | 240 | 240 |
| Bias Power (W) (13.56 MHz) | 0 | 70 | 70 | 70 |
| O₂ flow (sccm) | 10 | 10 | 10 | 10 |
| He flow (sccm) | 40 | 40 | 40 | 40 |
| N₂ flow (sccm) | 0 | 0 | 0 | 0 |
| Backside He pressure (T) | 8 | 8 | 8 | 8 |
| Time (s) | ~10-20 | 3 | EP mode | 5 |
| Glow discharge on-rate | N/A | Up to 70% | 0%/100% | 0%/100% |

As can be seen from Examples 1-3 and Comparative Examples A & B, the glow discharge on-rate of plasma etching apparatus is significantly improved by introduction of N₂ gas to form a N₂ memory species when power is applied. Additionally, lower chamber pressures can be maintained. In fact, the glow discharge on-rate observed in Examples 1-3 is significantly better than Comparative Example A, and better than Comparative Example B where increased pressures are employed.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising, in following order, the steps of:
   providing a plasma etching apparatus having an etching chamber;
   disposing a substrate to be etched in the chamber;
   introducing N₂ gas and one or more process gases into the chamber;
   stopping the introduction of N₂ gas into the chamber;
   applying power to an electrode in the chamber to form a first plasma glow discharge such that N₂ memory species are formed, which survive in an afterglow of the first plasma glow discharge; and
   igniting the one or more process gases in the chamber to form a second plasma glow discharge in the presence of the surviving N₂ memory species to etch the substrate.

2. The method according to claim 1, wherein the one or more process gases comprises O₂.

3. The method according to claim 1, wherein the substrate comprises a semiconductor device.

4. The method according to claim 1, wherein N₂ gas is introduced into the chamber at a rate of about 10 to about 500 sccm.

5. The method according to claim 1, wherein step of forming a first plasma glow discharge is carried out at a chamber pressure of about 2 to about 500 mTorr.

6. A method comprising, in following order, the steps of:
   providing a plasma etching apparatus having an etching chamber;
   disposing a substrate to be etched in the chamber;
   introducing N₂ gas and one or more process gases into the chamber;

applying power to an electrode in the chamber to form a first plasma glow discharge such that $N_2$ memory species are formed, which survive in an afterglow of the first plasma glow discharge;

stopping the introduction of $N_2$ gas into the chamber; and igniting the one or more process gases in the chamber to form a second plasma glow discharge in the presence of the surviving $N_2$ memory species to etch the substrate.

7. The method according to claim 6, wherein the one or more process gases comprise $O_2$.

8. The method according to claim 6, wherein the substrate comprises a semiconductor device.

9. The method according to claim 6, wherein $N_2$ gas is introduced into the chamber at a rate of about 10 to about 500 sccm.

10. The method according to claim 6, wherein applying power to an electrode in the chamber such that an $N_2$ memory species is formed is carried out at a chamber pressure of about 2 to about 500 mTorr.

11. The method according to claim 10, wherein the power applied to the electrode is about 50 to about 2500 W.

12. A method comprising, in following order, the steps of:
providing a plasma etching apparatus having an etching chamber;
disposing a substrate to be etched in the chamber;
introducing $N_2$ gas into the chamber;
applying power to an electrode in the chamber to form a first plasma glow discharge such that $N_2$ memory species are formed, which survive in an afterglow of the first plasma glow discharge;
removing the applied power from the electrode in the chamber;
stopping the introduction of the $N_2$ gas into the chamber and introducing one or more process gases into the chamber; and
igniting the one or more process gases in the chamber to form a second plasma glow discharge in the presence of the surviving $N_2$ memory species to etch the substrate.

13. The method according to claim 12, wherein the one or more process gases comprise $O_2$.

14. The method according to claim 12, wherein the substrate comprises a semiconductor device.

15. The method according to claim 12, wherein $N_2$ gas is introduced into the chamber at a rate of about 10 to about 500 sccm.

16. The method according to claim 12, wherein applying power to an electrode in the chamber such that an $N_2$ memory species is formed is carried out at a chamber pressure of about 2 to about 500 mTorr.

17. The method according to claim 16, wherein the power applied to the electrode is about 50 to about 2500 W.

* * * * *